US006649483B2

(12) United States Patent
Hartner et al.

(10) Patent No.: US 6,649,483 B2
(45) Date of Patent: Nov. 18, 2003

(54) METHOD FOR FABRICATING A CAPACITOR CONFIGURATION

(75) Inventors: Walter Hartner, Glen Allen, VA (US); Volker Weinrich, Paris (FR); Matthias Krönke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/996,959

(22) Filed: Nov. 20, 2001

(65) Prior Publication Data

US 2002/0155675 A1 Oct. 24, 2002

(30) Foreign Application Priority Data

Nov. 20, 2000 (DE) ........................................ 100 57 444

(51) Int. Cl.[7] ................................................ H01L 21/20
(52) U.S. Cl. ........................................................ 438/393
(58) Field of Search .................................. 438/393–396

(56) References Cited

U.S. PATENT DOCUMENTS 5,696,018 A * 12/1997 Summerfelt et al. ........ 438/396
5,789,291 A * 8/1998 Sung .......................... 438/254
6,365,453 B1 * 4/2002 Deboer ....................... 438/253
6,436,838 B1 * 8/2002 Ying et al. .................. 438/710
6,455,424 B1 * 9/2002 McTeer ...................... 438/675

FOREIGN PATENT DOCUMENTS

| | | |
|---|---|---|
| DE | 199 48 571 A1 | 4/2001 |
| JP | 10-12844 | 1/1998 |
| JP | 10-223855 | 8/1998 |
| WO | WO 97/35341 | 9/1997 |

* cited by examiner

*Primary Examiner*—David Nelms
*Assistant Examiner*—Thao Le
(74) *Attorney, Agent, or Firm*—Laurence A. Greenberg; Werner H. Stemer; Ralph E. Locher

(57) ABSTRACT

A method for fabricating a capacitor configuration in particular an FeRAM memory device includes the step of filling intermediate regions, which remain free after the formation of a capacitor device on a surface of a substrate, with at least one electrically insulating intermediate layer. The at least one electrically insulating intermediate layer is filled at least up to a level of a topmost layer of the capacitor device.

38 Claims, 2 Drawing Sheets

METHOD FOR FABRICATING A CAPACITOR CONFIGURATION

BACKGROUND OF THE INVENTION

FIELD OF THE INVENTION

The invention relates to a method for fabricating a capacitor configuration and in particular to a method for fabricating a capacitor configuration in which the integration of ferroelectric capacitors fabricated by a single-step patterning process is possible in a simple manner.

Modern memory devices use elementary memory cells for storing information. The memory cells have a capacitor device or the like as an elementary memory element. The desire for large scale integrated memory devices having a plurality of essentially identical memory cells makes it necessary to apply a capacitor configuration having a plurality of identical capacitor devices on a substrate, which, in particular, is a semiconductor substrate or the like. In this case, on the surface of the substrate which is used as a basis, the surface, if appropriate, is made such that it is correspondingly pre-patterned. In each case a sequence of specific layers or material layers is formed locally at predefined locations for providing a capacitor device. Consequently, at each of these predefined locations on the surface of the substrate, there is produced an individual separate capacitor device as an essentially layered structure and, overall, a corresponding sequence of a plurality of identical capacitor devices which then form the corresponding capacitor configuration of the memory device. This method for constructing the corresponding elementary memory elements in the form of capacitor devices is used in many memory modules, for example RAM (Random Access Memory) modules, in particular in FeRAM memory devices.

In principle, a number of different procedures are conceivable for the application of the individual layers. In so-called multi-step methods, the sequence of the individual material layers is applied to the surface of the substrate used as a basis in each case in a plurality of process steps. On account of the cell enlargements which are known in the case of multi-step methods and have a disadvantageous effect with regard to the highest possible integration density in the memory modules, a procedure has been adopted in which corresponding layer configurations are formed in a single-step method, in particular in the case of the so-called stacked cell principle, in which the layer configuration of the capacitor device is in each case formed directly above assigned circuit configurations formed within the substrate and is not offset laterally with respect thereto as in the case of the so-called offset cell principle.

After the formation of the layer structures, precisely in the single-step method, with regard to the further process steps—for example required annealing steps, external contact-connection to further metallization layers to be applied and the like—known methods encounter problems in preventing damage to the layer structure as a whole or to the individual layers e.g. on account of reactive processes with the process atmosphere—in particular with oxygen—or on account of interactions between the layers, precisely in the lateral region of the layer structure.

Thus, it can happen, for example, that the plug connections applied on the substrate surface are partially oxidized in the process atmosphere, thereby impairing or interrupting a desired electrical contact between a region in the substrate used as a basis and layers of the capacitor. Furthermore, leakage current sources caused by material reconfigurations and/or other reactive or oxidative processes may also be problematic.

SUMMARY OF THE INVENTION

It is accordingly an object of the invention to provide a method for fabricating a capacitor device on a substrate which overcomes the above-mentioned disadvantages of the heretofore-known methods of this general type and with which the sequence of layers of the capacitor device can be formed with a particularly high quality and/or yield in a particularly simple manner.

With the foregoing and other objects in view there is provided, in accordance with the invention, a method for fabricating a capacitor configuration including at least one capacitor device, the method includes the steps of:

providing a substrate;

applying a sequence of layers on the substrate by using a 2D patterning process wherein the layers of the sequence of layers respectively are applied in an area-covering manner and subsequently patterned with an etching operation in a common process step;

forming the layers of the sequence of layers locally on a surface of the substrate at respective given locations such that a capacitor device is provided; and filling free intermediate regions of the surface of the substrate with at least one electrically insulating intermediate layer up to a level of a topmost layer of the capacitor device.

The method according to the invention for fabricating a capacitor configuration having at least one capacitor device wherein intermediate regions of the surface of the substrate which remain free are filled with at least a first, at least essentially electrically insulating intermediate layer, in particular in each case at least up to the level of a topmost layer of the capacitor device. By virtue of this measure, at least the lateral areas and edges of the formed sequence of layers of the capacitor device are mechanically covered and thus protected against undesirable mechanical conversion processes, in particular with the process atmosphere during subsequent process steps. Furthermore, what is also achieved by the electrical insulation is that adjacent layer sequences of adjacent capacitor devices do not acquire electrical contact, which is undesired.

Consequently, it is a basic idea of the present invention that, after the formation of the sequence of layers of the capacitor device, at least the lateral regions or edge regions of the layer sequence of the capacitor device are covered by a corresponding intermediate layer applied in the intermediate regions between the capacitor devices and are thus protected against undesirable chemical conversion processes. Consequently, it is possible to prevent, in particular, the situation in which, for example in an oxygen-containing process atmosphere, the bottommost layer is oxidatively attacked from the lateral region and, as a consequence thereof, the contact between the underlying substrate or corresponding conductivity regions of the substrate and the subsequent layer of the capacitor device is interrupted.

In a preferred mode of the method according to the invention, it is provided that a contact layer is applied to and/or patterned onto the at least one intermediate layer at least in regions, in particular in order in each case to be at least electrically contact-connected to the topmost layer of the capacitor device at least in a central or edge-remote region thereof. In this way, it is possible to realize, in particular, an electrical contact-connection of the capacitor device in the form of the sequence of layers and a corresponding connection to the outside world. In this case, the regions on which the contact layer is applied on the first intermediate layer are chosen precisely in such a way as to produce a corresponding circuit configuration of the plurality of capacitor devices of the capacitor configuration.

During the patterning process of the sequence of layers of the capacitor devices, so-called redeposition effects often occur during specific processes. In this case, during material erosion operations, for example, portions of the eroded material are attached and deposited in the region of the surface of the substrate and, in particular, on the edge regions or lateral regions of the sequence of layers of the capacitor devices. These redepositions are also often referred to as fences and can extend from the edge regions or lateral regions of the sequence of layers also out of the plane of the substrate and, in particular, out of the plane of the topmost layer of the sequence of layers of the capacitor device.

In accordance with a particularly preferred embodiment of the method according to the invention, it is provided that the first intermediate layer is in each case filled essentially flush up to the level of the topmost layer of the capacitor device by a procedure in which, after the application of the intermediate layer, regions of the intermediate layer material which in each case project above the level of the topmost layer of the capacitor device are essentially eroded, in particular polished down, to the level of the topmost layer and of the capacitor device. This can be done in particular through the use of a CMP method, namely a chemical mechanical polishing method, or the like. The effect of the erosion to the level of the topmost layer of the capacitor device is that the surface of the topmost layer of the capacitor device is essentially not covered by the first intermediate layer.

What is achieved by the measure described last is that the redepositions or fences projecting above the level of the topmost layer are initially concomitantly embedded in the material of the intermediate layer that is first to be applied and are thus stabilized against breaking. The subsequent erosion of the material of the first intermediate layer down to the level of the topmost layer of the capacitor device, in particular through the polishing in the CMP method, is achieved such that the redepositions or fences are also removed down to the level of the topmost layer of the capacitor device. This makes it possible to effectively prevent particularly the risk of an electrical contact or short circuit between the layers of the capacitor device.

Although it suffices, in principle, after the application of the first intermediate layer and, if appropriate, the erosion or polishing-down thereof to the level of the topmost layer of the capacitor device, to directly form a corresponding metalization layer on the first intermediate layer for the purpose of contact-connecting the capacitor device, it is particularly advantageous, however, if, in accordance with a further preferred mode of the method according to the invention, a second, in particular essentially electrically insulating, intermediate layer is applied to the first intermediate layer and/or the topmost layer of the capacitor device, in particular in order that an electrical contact, short circuits or the like in each case among layers of the capacitor device, for example on account of redepositions, fences or the like—precisely in the edge region or lateral region of the sequence of layers—are reduced or avoided to the greatest possible extent during operation.

After the application of the second intermediate layer, if appropriate the corresponding contact layer is then applied to and/or patterned onto the second intermediate layer, in which case—as has already been described above—the contact layer is contact-connected to the topmost layer of the capacitor device in a central region and/or in a region remote from the edge thereof. What is achieved by these measures is that regions of the redepositions or fences which extend as far as the level of the topmost layer of the capacitor device and, if appropriate, terminate with this are covered by the second intermediate layer, which is likewise formed such that it is electrically insulating, and this then has the result of preventing electrical contact of the redepositions of the layers, which lie one above the other, directly among one another or indirectly via the contact layer and thus prevents electrical contact between these layers.

In a further preferred mode of the method according to the invention it is provided that essentially the same material, in particular a dielectric such as $SiO_x$ or the like, is used for the first and for the second intermediate layer. To supplement this or as an alternative to this, it is provided that both intermediate layers are applied in a common process step, as a result of which particularly a simple method control is produced and presupposes, however, that the redepositions or fences which extend beyond the level of the topmost layer of the capacitor device have been removed in another way beforehand or else are not present in this form.

During the application and patterning of the layers for the capacitor devices, it is also important in the single-step method to avoid possible chemical conversion processes, in particular oxidations or the like, of the individual layers with the process atmosphere.

In accordance with a further mode of the invention, it is provided that the sequence of layers for the at least one capacitor device is constructed through the use of a 2D patterning method on the substrate.

This is done, in particular, by the layers in each case being applied in a whole-area and/or large-area manner, preferably in a common process step, on the substrate and then subsequently being patterned in an etching operation or the like, preferably in a common process step and, if appropriate, after a heat treatment step, e.g. an $O_2$ annealing step, at relatively high temperatures. The large-area configuration of the layers means that the attack area at the lateral areas or lateral edge regions of the layer structure is kept particularly small, so that chemical conversion processes or oxidations precisely cannot occur in particular in those regions which are then reconstructed by the method step of patterning to form the actual layer sequences of the capacitor devices.

Therefore, it is preferred that, during the etching operation or the like, essentially a plasma process or the like, preferably in an argon- and/or chlorine-containing atmosphere, is carried out, preferably using resist mask configurations or the like. By virtue of this procedure, a particularly favorable imaging behavior can be achieved through the setting of the argon/chlorine mixture and the use of resist masks during the plasma process or sputtering process, so that faceting effects and dimensional expansions are avoided to the greatest possible extent.

It is furthermore preferred that, in the sequence of layers of the capacitor device, in each case at least a lower electrode layer, an upper electrode layer and, in between, a dielectric layer are formed, the lower electrode layer being made such that it essentially faces the substrate and the upper electrode layer being made such that it is essentially remote from the substrate. As a result, a capacitor device in the form of a layer structure is formed in a particularly suitable manner, the lower electrode layer serving as a bottom electrode and the upper electrode layer serving as a top electrode.

In order to ensure that the structures formed below the capacitor device in the substrate are protected during fabrication and during operation, in accordance with a further mode of the invention it is provided that a barrier layer is formed between the substrate and the lower electrode layer or bottom electrode, in particular in order that surface regions of the substrate are shielded and protected from a process gas, in particular from oxygen or the like, during patterning, during further processing steps and/or during operation.

In particular, ferroelectric and/or paraelectric materials are used as dielectric material. $SrBi_2(Ta,Nb)_2O_9$ (SBT, SBTN), $Pb(Zr,Ti)O_3$ (PZT)), $Bi_4Ti_3O_{12}$ (BTO), $(Ba,Sr)TiO_3$ (BST) or the like are particularly suitable in this case.

In particular, an oxygen-resistant, metallic material, in particular a noble metal or the like, is suitable as materials for the lower and/or the upper electrode layer. Pt, Pd, Ir, Rh, Ru, $RuO_x$, $IrO_x$, $RhO_x$, $SrRuO_3$, LSCO ($LaSrCoO_x$), $YBa_2Cu_3O_7$, high-temperature super-conductors or the like are preferred in this case.

Essentially a dielectric material, e.g. silicon oxide or the like, is provided as a material for the at least one intermediate layer.

Platinum, aluminum and/or the like is particularly suitable as material for the contact layer.

Preferably, the corresponding capacitor devices and their layer structures are in each case applied in the region of a plug of the substrate or the like.

During the patterning of the capacitor device or capacitor devices, in particular in the context of a 2D patterning operation, it is possible to use, in principle, so-called resist masks or the like at moderate etching temperatures. However, a particularly advantageous mode of the method according to the invention uses, for the patterning of the capacitor device, in each case a hard mask, in particular made of silicon oxide or the like, preferably in the context of a hot cathode etching operation. This procedure has the advantage that at most slight redepositions or fences occur during the etching process itself. Resist masks are not suitable, however, for such a high-temperature etching process.

After the actual patterning operation, namely the etching, part of the hard mask has been eroded by the etching operation itself, but part of the hard masks is still situated on the topmost layer of the capacitor devices, namely e.g. the top electrode. This covering layer on the top electrode in the form of the hard-mask residue can be eroded e.g. by a corresponding polishing method—e.g. a CMP method—down to the level of the surface of the top electrode. It is advantageous in this case for the intermediate regions between the patterned capacitor devices and, consequently, the semiconductor substrate surfaces that have remained free to be filled beforehand with at least one intermediate layer. What is achieved as a result is that the patterned capacitor devices are mechanically stabilized during the actual polishing method.

In this case, the hard-mask residue is preferably also concomitantly embedded in the intermediate layer, e.g. by correspondingly selecting the layer thickness of the intermediate layer correspondingly beyond the level of the surface of the top electrode.

In accordance with this mode of the invention, then, after the patterning of the capacitor device, the latter and the hard mask on the top electrode are embedded in at least one common intermediate layer and then subsequently polished down to the level of the surface of the top electrode.

Further properties and aspects of the invention can be summarized as explained below:

In order to fabricate ferroelectric capacitors for applications in nonvolatile semiconductor memories having a high integration density, a ferroelectric material, for example $SrBi_2(Ta,Nb)_2O_9$ (SBT, SBTN), $Pb(Zr,Ti)O_3$ (PZT), $Bi_4Ti_3O_{12}$ (BTO), $(Ba,Sr)TiO_3$ (BST) or the like, is used as a dielectric between the electrodes of a capacitor. Paraelectric materials, such as, for example, $(Ba,Sr)TiO_3$ (BST), can also be used. The electrode material is a noble metal which withstands high temperatures in oxygen. Appropriate materials for this are Pt, Pd, Ir, Rh, Ru, $RuO_x$, $IrO_x$, $RhO_x$, $SrRuO_3$, LSCO ($LaSrCoO_x$), $YBa_2Cu_3O_7$ and high-temperature superconductors. In general, the capacitor construction involves, in a conventional manner, either following the technologically more demanding stacked principle or else proceeding according to the offset cell principle, which takes up a great deal more space.

A high integration density is generally achieved only using a so-called single-step method, because the latter allows steep sidewalls on the patterned layer structures since appreciable dimensional expansions and faceting of the masks do not occur.

Both the stacked principle and the offset principle require process steps for patterning the electrodes of the capacitor devices, namely the lower electrode or bottom electrode and the upper electrode or top electrode. During the patterning of new electrode materials such as platinum, for example, a plasma process or sputtering process is typically used in the case of large scale integration. The material erosion from the coated substrate in the unmasked regions on the substrate wafer is effected by the sputtering removal under bombardment e.g. with chlorine ions and/or argon ions.

In order to be able to realize very small and fine structures dimensionally accurately, it is necessary that the structure of the resist mask can be transferred to the platinum layer or the like which is to be patterned, without changing the so-called critical dimension (CD). However, primarily when reactive process gases are used, a sputtering attack of ions leads to faceting, beveling or tapering of the resist mask and, consequently, to corresponding faceting when transferring the structure, for example in platinum. This faceting limits the size of the smallest structures that can be obtained.

It is known that the most severe faceting is established in pure chlorine plasmas. By contrast, with an increasing proportion of argon in a chlorine/argon mixture, the sidewall angle increases during the material erosion. On the other hand, the use of pure noble gas as process gas during the plasma etching admittedly results in practically no faceting of the resist mask and, accordingly, no faceting or beveling of the transferred structure. As a consequence, however, so-called redepositions or fences can form at the etching edge obtained, that is to say e.g. in the lateral region or edge region of the layer structure to be applied. The redepositions or fences are particularly high if the layer structure of the capacitor device to be applied, namely the sequence of barrier layer or oxygen barrier, bottom electrode, ferroelectric dielectric and top electrode, is formed in one step.

As has already been explained above, the invention's process of filling with an intermediate layer or with an intermediate oxide beyond the level of the topmost layer of the capacitor devices, redepositions or fences which project beyond the level of the topmost layer of the capacitor device being embedded precisely in the intermediate oxide, and the subsequent process of polishing back down to the level of the topmost layer of the capacitor device are advantageous because the fences or redepositions, which can lead to short circuits between the layers of the sequence of layers of the capacitor device, are prevented to the greatest possible extent by these measures. Short circuits could happen to subsequent levels of metallization, or, after breaking or bonding of fences, to neighboring structures.

A further problem is the oxidation of structures in the region of the surface or below the surface of the substrate during further process steps that are to be completed after the application of the layers. In this case, it is particularly problematic that in a plurality of ferroelectric dielectrics during the formation of a complete ceramic structure and during annealing, oxygen is absolutely necessary as the process atmosphere.

In order in this case to prevent oxidation, in particular of polysilicon plugs or of W plugs, an essentially electrically conductive oxygen barrier or barrier layer is required as the bottommost layer, that is to say as the layer between the bottommost electrode layer and the substrate surface. It is known that during the patterning in stages of the capacitor device or of the layer sequence of the capacitor device, that is to say during separate patterning of barrier layer, bottom electrode, ferroelectric and top electrode, during conventional patterning methods and fabrication methods of capacitor devices, the contact layers in the barrier stack can be oxidized from the side, that is to say from lateral regions or edge regions, during oxygen annealing, and that in this case the bottom electrode connection toward the substrate, in particular toward the corresponding plugs, can be at least partially destroyed.

The barrier layer may also have a layer sequence, e.g. TaSi/TaSiN or the like.

By contrast, in the case of the above-described mode of the method according to the invention for fabricating the capacitor devices of a capacitor configuration, the large-area or whole-area formation of the layer structure for the respective capacitor devices on the entire wafer, i.e. on the entire substrate, means that a particularly large overlap between the individual layers is produced and, as a result, degradation of the oxygen barriers and of the plug structures in the substrate is prevented. Specifically, it has been shown that the overlap between bottom electrode/lower electrode layer and underlying barrier layer is of particular importance. The larger this overlap between the layers is made, the fewer oxidation processes can act from the side on the oxygen barrier and thus on the contact between plug and bottom electrode. Consequently, this means that more capacitors are produced, according to the invention, in the capacitor configuration with a higher quality and/or yield. In this case, it is of particular importance that all the coating processes, heat treatments and annealing processes which are required for fabricating the ferro-electric capacitor or the like are initially carried out on the whole-area layers. Only afterward is the configuration of the individual capacitors on the substrate realized in a single etching step or in a plurality of etching steps, in which case, after the embedding process in the intermediate oxide, the redepositions or fences then subsequently have to be polished down.

This means, then, that after the patterning of the individual capacitor modules, in one step in each case, an embedding process for example in silicon oxide as an intermediate oxide is performed, the projecting intermediate oxide then subsequently being polished, for example through the use of a CMP method, down to the level of the top electrodes, with the result that the top electrodes are uncovered and ready for further coating, either with a further intermediate oxide or dielectric or directly with a contact layer.

Other features which are considered as characteristic for the invention are set forth in the appended claims.

Although the invention is illustrated and described herein as embodied in a method for fabricating a capacitor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
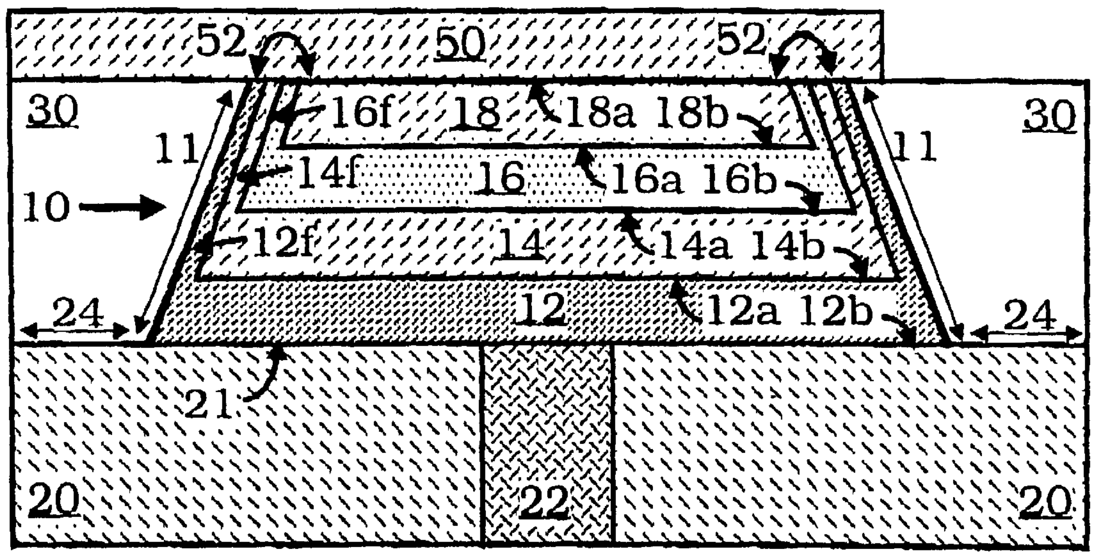
FIG. 1 is a diagrammatic cross-sectional side view of a capacitor device which has been fabricated in accordance with a first mode of the method according to the invention.

Referring now to the figures of the drawings in detail and first, particularly, to FIG. 1 thereof, there is shown a capacitor configuration 10 which has been produced on a substrate 20 in accordance with one mode of the method according to the invention.

The substrate 20 includes, for example, a semiconductor substrate in whose core region a plug 22 is formed, for making contact with deeper structures. The actual capacitor device 10 with a sequence of layers 12, 14, 16, 18 is then formed above the plug 22 on the substrate surface 21. The layers 12, 14, 16, 18 have respective surfaces 12*a*, 12*b*, 14*a*, 14*b*, 16*a*, 16*b*, 18*a*, 18*b*. The layer 12 provided at the very bottom on the surface 21 of the substrate 20 is the so-called barrier layer or oxygen barrier 12, which is intended to prevent an oxidative attack on the plug region 22 of the substrate 20 and on the contact between plug 22 and the capacitor device 10. A dielectric layer 16 is formed between the bottom electrode 14 or lower electrode layer and the top electrode 18 or upper electrode layer. The top electrode 18 is contact-connected to the outside by a contact layer 50, which may be produced from platinum, aluminum or the like.

The process of filling with intermediate oxide 30 and the subsequent process of polishing down to the level of the surface 18*a* of the top electrode 18 result in a configuration in which the intermediate oxide or the intermediate layer 30 terminates flush with the surface 18*a* of the top electrode 18, in other words the latter remain free and uncovered, the intermediate regions 24 of the surface 21 of the substrate 20 being covered by the intermediate oxide 30. Due to this intermediate layer 30, the lateral region or edge region 11 of the capacitor device 10 is at least partially protected against chemical attacks.

The contact layer 50 is composed of an electrically conductive material, for example platinum, aluminum or the like. The top electrode 18, the bottom electrode 14 and the oxygen barrier layer 12 are, by their nature, likewise electrically conductive. On account of the redepositions or fences 12f, 14f and 16f which are present up to the surface 18a of the top electrode 18 in the edge region 11 and are produced during the patterning of the barrier layer 12, of the lower electrode layer 14 and of the dielectric layer 16, leakage currents between the top electrode 18, on the one hand, and the bottom electrode 14, on the other hand, arise indirectly via the contact layer 50, via the regions 52 indicated by arrows. In specific applications, these leakage currents might be disadvantageous because above a specific magnitude, on account of the small ohmic resistance then present, they must be interpreted virtually as a short circuit of the capacitor electrodes 14 and 18.

In order to avoid such a short-circuit behavior, in an alternative embodiment of the method according to the invention for producing a corresponding capacitor device 10, after the application of the first intermediate layer 30, the metallic contact layer 50 is not applied directly, rather the procedure continues with a second intermediate layer 40, which includes an essentially electrically insulating dielectric. In this way, a short circuit, as was indicated in the region 52 in FIG. 1, is avoided in regions 42, i.e. thus in the neighboring region of the redepositions 14f of the bottom electrode and of the top electrode 16 in the region of the surface 18a of the top electrode. Only after the complete application of the second intermediate layer 40 and thus the coverage of the regions of the fences 12f, 14f and 16f is the metallization layer 50 applied in a central region 54, situated above the top electrode 18, and fully patterned there for the purpose of making contact with the top electrode 18.

In the first exemplary embodiment of FIG. 1, after the application of the first intermediate oxide layer 30, a contact layer 50 is subsequently applied, for example in the form of a platinum layer. An aluminum layer may also optionally be deposited. This is then subsequently patterned and then serves as a metallization plane, for example as a common plate.

Aluminum can be used as a metallization plane at this point, instead of platinum, which is expensive, only when all high-temperature steps, in particular all annealing processes, are already effected before the patterning of the capacitor module, as is the case with 2D patterning, described above.

The subsequent annealing processes for annealing etching damage of subsequent process steps can and must then be carried out at lower temperatures which then do not lead to damage of the aluminum.

If it is necessary, on the other hand, that oxygen can reach the ferroelectric during a subsequent annealing process, in order, for example, to continue or terminate a corresponding ceramic process, recrystallizaton and/or conditioning processes, platinum must nevertheless be used, however, as contact layer 50 since only this is inert at the temperatures used and is transparent relative to oxygen.

The advantage of this embodiment of the fabrication method for a capacitor device is that a lithography plane is obviated relative to a customary tungsten/aluminum metallization. Moreover, it is possible at this point to dispense with tungsten deposition for top electrode contact-connection, which might otherwise lead to degradation of the ferro-electric.

The redepositions 12f, 14f which are illustrated in FIG. 1 and are at least partially contact-connected to one another via the leakage current region 52 involve, as has already been mentioned above, the risk of a short circuit between the top and bottom electrodes. The risk of such a short circuit increases if the proportion of argon in the etching plasma during the sputtering process is increased in order, for example, to minimize the faceting effect, because the proportion and the extent of redepositions and fences are then increased.

Figure 2:
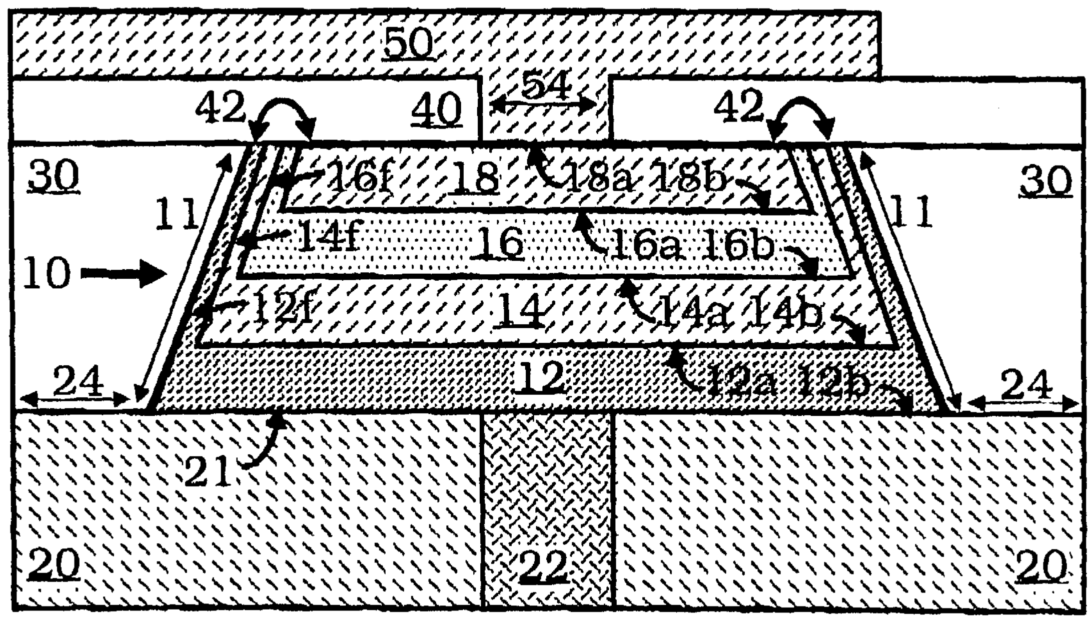
FIG. 2 is a diagrammatic cross-sectional side view of a capacitor device which has been fabricated in accordance with a further mode of the method according to the invention.

In order to avoid this problem, in the embodiment of the method according to the invention which forms the basis of the configuration in FIG. 2, a further thin dielectric layer 40, if appropriate likewise made of $SiO_x$, is deposited onto the polished intermediate oxide 30. The layer is suitable for avoiding the above-described possible short circuit via the regions 52 in FIG. 1; the regions 42 in FIG. 2 do not produce electrical contact between the top electrode 18 and the redeposition 14f of the bottom electrode 14. However, a further lithography plane is correspondingly necessary, in contrast to the embodiment which forms the basis of the configuration from FIG. 1 and in the case of which the risk of a short circuit is not precluded.

An additional possible advantage of the embodiment of the method according to the invention which forms the basis of the configuration from FIG. 1 is that the electrical contact between the top electrode 18 and the bottom electrode 14, namely in the region 52 via the surface 18a of the top electrode 18 and via the corresponding redeposition 14f, prevents the formation of an unintended electrical potential difference between the electrodes 14, 18 on account of a leakage current. If the leakage current, which, via the region 52, continually compensates an electrical potential difference building up latently, is not disadvantageous or harmful for the switching operations and the reading of the information from the capacitor 10, then a second intermediate layer 40, as is shown in FIG. 2, is obsolete. In this case, rather, the continual discharging of top electrode 18 and bottom electrode 14 relative to one another helps to counteract a loss of information which might result from polarization reversal at least in regions on account of "static electricity".

FIGS. 3A to 3D show sectional side views of a plurality of intermediate stages of a capacitor device 10 on a semiconductor substrate 20, which capacitor device is fabricated in accordance with another embodiment of the method according to the invention, namely through the use of a so-called hard-mask hot cathode etching method.

Figure 3A:
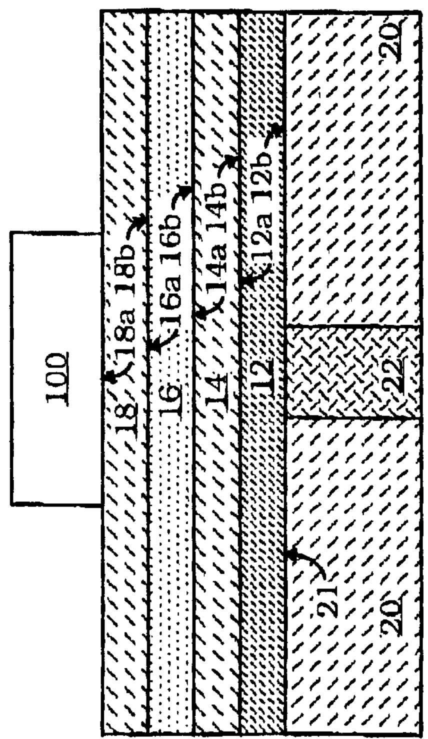
FIGS. 3A–3D are diagrammatic cross-sectional side views for illustrating intermediate stages of a capacitor device during the fabrication in accordance with the invention.

In the state shown in FIG. 3A, a sequence of layers 12, 14, 16, 18 has been applied over the whole area on the surface 21 of a semiconductor substrate 20, the individual layers 12, 14, 16 and 18 essentially corresponding to those of FIGS. 1 and 2.

In the region of a plug 22 provided in the semi-conductor substrate 20, a so-called hard mask 100 is applied on the sequence of layers, on the surface 18a of the topmost layer 18.

The hard mask 100 masks the underlying region of the sequence of layers above the plug 22, so that, during an etching operation that is to be performed, this region is present in essentially protected form and cannot be patterned or eroded.

Figure 3B:
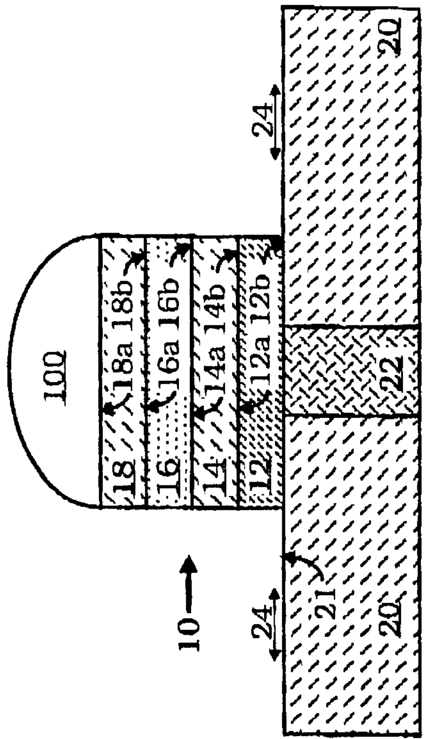

FIG. 3B shows the result of an etching operation applied to the configuration of FIG. 3A. The hard mask 100 itself has partially been attacked and eroded in the context of the etching operation itself. The sequence of layers 12, 14, 16 and 18 has been eroded down to the surface 21 of the semiconductor substrate 20, so that regions 24 remaining free are present on the surface 21 of the semiconductor substrate 20, but only outside the region covered by the hard mask 100, in the vicinity of the plug 22.

Figure 3C:
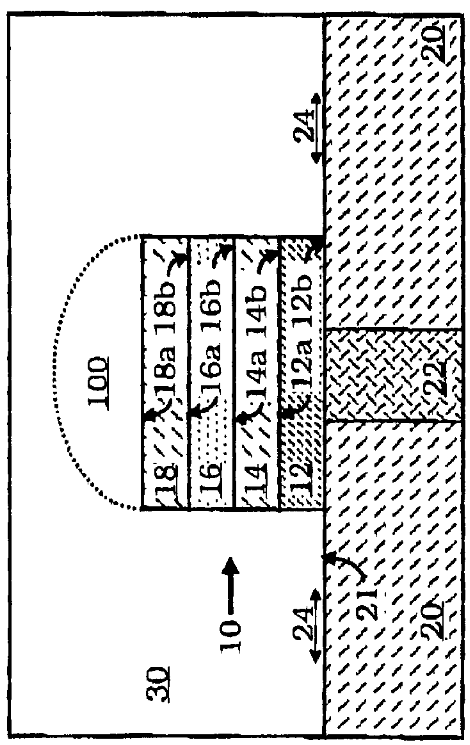

In a subsequent process step, an intermediate layer 30 is applied to the structure shown in FIG. 3B, thereby achieving the intermediate stage which is shown in FIG. 3C during the fabrication of the capacitor device by the method according to the invention. By virtue of the intermediate layer 30, the layer sequence of the capacitor device 10 together with the hard mask 100 bearing on the surface 18*a* of the top electrode 18 is embedded and, consequently, mechanically stabilized.

Figure 3D:
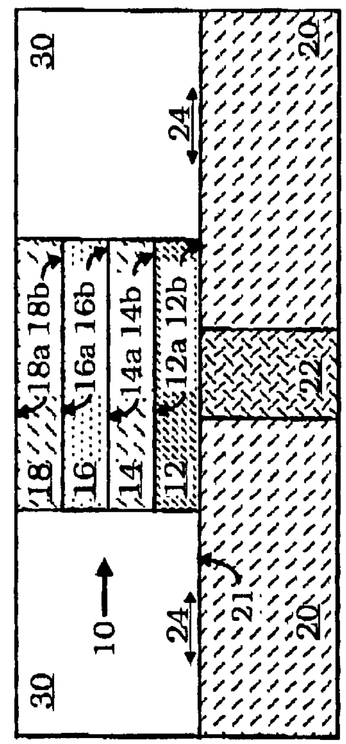

On account of this suitable mechanical stabilization, the intermediate layer 30 together with the hard mask 100 can then be polished, in a polishing step, down to the level of the surface 18*a* of the top electrode 18, without the occurrence of appreciable lateral mechanical loading on the layer sequence of the capacitor device 10. The result of the polishing step is shown in FIG. 3D, in which case the contact-connection of the top electrode 18 by a corresponding metallization layer, as is shown in FIGS. 1 and 2, then still has to be effected in a subsequent step.

We claim:

1. A method for fabricating a capacitor configuration having at least one capacitor device, the method which comprises:

providing a substrate having a surface;

applying a sequence of layers on the substrate by using a 2D patterning process wherein the layers of the sequence of layers respectively are applied in an area-covering manner and subsequently patterned with an etching operation in a common process step;

forming the layers of the sequence of layers locally on the surface of the substrate at respective given locations such that a capacitor device is provided, thereby leaving exposed free intermediate regions of the surface of the substrate between the locations; and filling the free intermediate regions of the surface of the substrate with at least one electrically insulating intermediate layer up to a level of a topmost layer of the capacitor device.

2. The method according to claim 1, which comprises providing a semiconductor substrate as the substrate.

3. The method according to claim 1, which comprises providing an FeRAM memory device as the capacitor device.

4. The method according to claim 1, which comprises applying the layers of the sequence of layers in a common process step.

5. The method according to claim 1, which comprises one of applying and patterning a contact layer onto the at least one electrically insulating intermediate layer at least in given regions of the intermediate layer.

6. The method according to claim 5, which comprises providing the contact layer such that the contact layer is at least electrically contacting the topmost layer of the capacitor device in at least in one region selected from the group consisting of a central region of the topmost layer and an edge-remote region of the topmost layer.

7. The method according to claim 1, which comprises forming the at least one electrically insulating intermediate layer substantially flush with the level of the topmost layer of the capacitor device by eroding portions of the at least one electrically insulating intermediate layer projecting above the level of the topmost layer substantially to the level of the topmost layer of the capacitor device subsequent to applying the at least one electrically insulating intermediate layer.

8. The method according to claim 7, which comprises eroding the portions of the at least one electrically insulating intermediate layer projecting above the level of the topmost layer by using a CMP process.

9. The method according to claim 7, which comprises applying a further electrically insulating intermediate layer to at least one of the at least one electrically insulating intermediate layer and the topmost layer of the capacitor device.

10. The method according to claim 9, which comprises applying the further electrically insulating intermediate layer such that an electrical contact among layers of the capacitor device is substantially prevented during operation.

11. The method according to claim 9, which comprises applying the further electrically insulating intermediate layer such that at least one of an electrical short circuit and an electrical contact among layers of the capacitor device caused by one of redepositions and fences is substantially prevented during operation.

12. The method according to claim 9, which comprises one of applying and patterning a contact layer on the further electrically insulating intermediate layer.

13. The method according to claim 9, which comprises using substantially identical materials for the at least one electrically insulating intermediate layer and the further electrically insulating intermediate layer.

14. The method according to claim 13, which comprises using a dielectric material for the at least one electrically insulating intermediate layer and the further electrically insulating intermediate layer.

15. The method according to claim 14, which comprises using $SiO_x$ as the dielectric material with x being a positive number.

16. The method according to claim 13, which comprises applying the at least one electrically insulating intermediate layer and the further electrically insulating intermediate layer in a common process step.

17. The method according to claim 1, which comprises structuring the sequence of layers subsequent to a heat treatment step.

18. The method according to claim 17, which comprises using an $O_2$ annealing step as the heat treatment step.

19. The method according to claim 17, which comprises using an etching operation during the structuring step.

20. The method according to claim 19, which comprises using a plasma process for the etching operation.

21. The method according to claim 20, which comprises carrying out the plasma process in at least one of an argon atmosphere and a chlorine atmosphere.

22. The method according to claim 19, which comprises using resist masks for the etching operation.

23. The method according to claim 16, which comprises providing, in the sequence of layers of the capacitor device, at least a lower electrode layer, an upper electrode layer, and a dielectric layer disposed between the lower electrode layer and the upper electrode layer such that the lower electrode layer substantially faces the substrate and the upper electrode layer is substantially remote from the substrate.

24. The method according to claim 23, which comprises providing a barrier layer between the substrate and the lower electrode layer.

25. The method according to claim 24, which comprises providing the barrier layer such that surface regions of the substrate are shielded from a process gas during the 2D patterning process.

26. The method according to claim 24, which comprises providing the barrier layer such that plug regions of the substrate are shielded from a process gas during the 2D patterning process.

27. The method according to claim 24, which comprises providing the barrier layer between the substrate and the lower electrode layer such that such that surface regions of the substrate are shielded from oxygen during the 2D patterning process.

28. The method according to claim 23, which comprises using at least one of a ferroelectric material and a paraelectric material for the dielectric layer.

29. The method according to claim 23, which comprises using a material selected from the group consisting of an oxygen-resistant material, a metallic material, a noble metal, and a high-temperature superconductor as a material for at least one of the lower electrode layer and the upper electrode layer.

30. The method according to claim 1, which comprises using a dielectric material for the at least one electrically insulating intermediate layer.

31. The method according to claim 30, which comprises using silicon oxide as the dielectric material.

32. The method according to claim 5, which comprises using a metal selected from the group consisting of platinum and aluminum as a material for the contact layer.

33. The method according to claim 1, which comprises applying the capacitor device in a region of a plug in the substrate.

34. The method according to claim 1, which comprises using a hard mask for patterning the capacitor device.

35. The method according to claim 34, which comprises using a silicon oxide mask as the hard mask.

36. The method according to claim 34, which comprises using the hark mask in a hot cathode etching operation.

37. The method according to claim 34, which comprises:

embedding the capacitor device and the hard mask provided on a top electrode of the capacitor device in the at least one electrically insulating intermediate layer subsequent to patterning the capacitor device; and subsequently eroding the at least one electrically insulating intermediate layer together with the hard mask down to a level of a surface of the top electrode such that the surface of the top electrode is substantially uncovered and the top electrode terminates essentially flush with a surface of the at least one electrically insulating intermediate layer.

38. The method according to claim 37, which comprises eroding the at least one electrically insulating intermediate layer by using a polishing process.

* * * * *